US007079306B2

(12) United States Patent
McGeoch

(10) Patent No.: US 7,079,306 B2
(45) Date of Patent: Jul. 18, 2006

(54) OPTICALLY ADDRESSED EXTREME ULTRAVIOLET MODULATOR AND LITHOGRAPHY SYSTEM INCORPORATING MODULATOR

(75) Inventor: Malcolm W. McGeoch, Brookline, MA (US)

(73) Assignee: Plex LLC, Cambridge, MA (US)

( * ) Notice: Subject to any disclaimer, the term of this patent is extended or adjusted under 35 U.S.C. 154(b) by 0 days.

(21) Appl. No.: 10/921,567

(22) Filed: Aug. 19, 2004

(65) Prior Publication Data

US 2005/0068613 A1 Mar. 31, 2005

Related U.S. Application Data

(60) Provisional application No. 60/497,204, filed on Aug. 22, 2003.

(51) Int. Cl.
G02B 26/08 (2006.01)

(52) U.S. Cl. .............. 359/298; 359/254; 359/259; 359/316; 359/290; 359/291; 250/492.2

(58) Field of Classification Search ............ 359/398, 359/290, 254, 291
See application file for complete search history.

(56) References Cited

U.S. PATENT DOCUMENTS

| 5,177,628 A | 1/1993 | Moddel |
| 5,178,445 A | 1/1993 | Moddel et al. |
| 5,486,936 A | 1/1996 | Fujikake et al. |
| 5,546,181 A | 8/1996 | Kobayashi et al. |
| 5,617,203 A | 4/1997 | Kobayashi et al. |
| 5,637,883 A | 6/1997 | Bowman et al. |
| 5,691,541 A | 11/1997 | Ceglio et al. |
| 5,691,836 A | 11/1997 | Clark |
| 5,841,489 A | 11/1998 | Yoshida et al. |
| 6,025,950 A | 2/2000 | Tayebati et al. |
| 6,084,656 A | 7/2000 | Choi et al. |
| 6,140,660 A | 10/2000 | Mermelstein |
| 6,159,643 A | 12/2000 | Levinson et al. |
| 6,366,389 B1 | 4/2002 | Wraback et al. |

(Continued)

FOREIGN PATENT DOCUMENTS

WO WO 01/90439 A1 11/2001

OTHER PUBLICATIONS

Oldham et al., "Mirror-Based Pattern Generation For Maskless Lithography", EECS Department, University of California, Berkeley, CA 94720, private communication, Dec. 2003.

(Continued)

Primary Examiner—Nikita Wells
Assistant Examiner—Johnnie L Smith, II
(74) Attorney, Agent, or Firm—Wolf, Greenfield & Sacks, P.C.

(57) ABSTRACT

An optically addressed extreme ultraviolet (EUV) modulator in which a spatial amplitude or phase pattern is provided to an EUV beam that is reflected from, or transmitted through the modulator. The modulator includes a modulator structure that includes a material with a high coefficient of thermal expansion. When a thermal impulse is incident on one part of the modulator, the resulting expansion changes the reflected phase or amplitude of the EUV beam from that part. A thermal pattern is imprinted on the modulator by absorption of a visible or ultraviolet pattern, resulting in a corresponding modulation of the EUV beam. A lithography system is based on the optically addressed EUV modulator.

36 Claims, 6 Drawing Sheets

U.S. PATENT DOCUMENTS

| | | | |
|---|---|---|---|
| 6,373,619 B1 * | 4/2002 | Sandstrom | 359/298 |
| 6,399,261 B1 * | 6/2002 | Sandstrom | 430/30 |
| 6,416,855 B1 | 7/2002 | Rossignol et al. | |
| 6,479,195 B1 | 11/2002 | Kirchauer et al. | |
| 6,489,984 B1 * | 12/2002 | Johnson | 347/239 |
| 6,498,685 B1 | 12/2002 | Johnson | |
| 6,548,820 B1 | 4/2003 | Mermelstein | |
| 6,687,041 B1 * | 2/2004 | Sandstrom | 359/291 |
| 2003/0202233 A1 * | 10/2003 | Sandstrom | 359/290 |
| 2005/0225836 A1 * | 10/2005 | Sandstrom | 359/291 |

OTHER PUBLICATIONS

Choksi et al., *"Maskless Extreme Ultraviolet Lithography"*, J. Vac. Sci. Technol. B 17(6), Nov./Dec. 1999, pps. 3047-3051.

Choksi et al., *"Maskless Extreme Ultraviolet Lithography"* J. Vac. Sci. Technol. B 17(6), Nov./Dec. 1999, pp. 3047-3051.

Search Report dated Apr. 11, 2005 from corresponding International Application No. PCT/US2004/027049.

* cited by examiner

OPTICALLY ADDRESSED EXTREME ULTRAVIOLET MODULATOR AND LITHOGRAPHY SYSTEM INCORPORATING MODULATOR

CROSS-REFERENCE TO RELATED APPLICATION

This application claims the benefit of provisional application Ser. No. 60/497,204, filed Aug. 22, 2003, which is hereby incorporated by reference in its entirety.

FIELD OF THE INVENTION

This invention relates to a modulator for extreme ultraviolet or soft X-ray radiation. The modulator is particularly useful in lithography systems, but is not limited to lithography applications.

BACKGROUND OF THE INVENTION

The process of maskless lithography using photons, as disclosed in U.S. Pat. No. 5,691,541, issued Nov. 25, 1997 to Ceglio and Markle, utilizes a "programmable array of binary light switches" that generates a spatially modulated light field. The modulated light field is then relayed optically to the surface of a substrate that receives the desired circuit pattern. Ceglio and Markle discuss the use of extreme ultraviolet (EUV) light and a digital micro-mirror array in which the pixels comprise individual EUV mirrors that are tilted to either direct light to the substrate, or not. Ceglio and Markle disclose a programmable array comprising active elements that can be digitally programmed via direct electrical connection to a drive circuit. To program the pixels, it is usually proposed to have a matrix of wires that carry electrical signals to micro-mirrors at the intersections of pairs of wires. This arrangement becomes more difficult to fabricate as the circuit scale size is reduced, and limits the speed with which the whole array can be addressed.

Prior art optically addressed light modulators depend upon the relatively high refractive index changes that are available in the visible or ultraviolet spectral ranges, at wavelengths longer than the primary optical transitions relating to the first electronic excitation in optically transmissive media. The extreme ultraviolet, or soft X-ray region does not afford either high refractive indexes, or transmissive optical media, with which to construct the prior modulator designs. In the extreme ultraviolet region, practical modulators have to work in the reflective mode, or otherwise involve the use of sub-micron thickness films if they are to work in the transmission mode. An optically addressed modulator disclosed in U.S. Pat. No. 5,691,836, issued Nov. 25, 1997 to Clark, which operates by reflection from a mirror surface, involves an intermediate electronic drive circuit and the additional complexity of micro-lenses.

Accordingly, there is a need for novel modulators for extreme ultraviolet and soft X-ray radiation.

SUMMARY OF THE INVENTION

The present invention provides very rapid spatial addressing of a modulator without requiring a matrix of addressing wires and associated switching circuits. Instead, a desired spatial pattern is imprinted on the modulator by an optical beam. The modulator includes multilayer mirrors that reflect with changed amplitude and/or phase when subjected to a temperature impulse. The imprinting optical beam supplies a spatial pattern that is absorbed in the modulator structure, becoming a thermal pattern. The modulator structure contains at least one layer of optically absorbing material with a high coefficient of thermal expansion. In regions of high optical intensity, this layer expands, modifying the amplitude and/or phase of EUV or soft X-ray radiation reflected by the modulator structure in such regions.

The modulator of the present invention is passive, in the sense that no electric power is required to drive the modulator, and does not require micro-lenses. The thermal expansion principle is much more effective for the modulation of extreme ultraviolet or soft X-ray radiation because in these regions of the spectrum significant phase changes only require motions of the order of one nanometer, which are readily achieved in materials of high thermal expansion coefficient with temperature excursions as small as a few tens of degrees Centigrade. Such small motions are not able to impress significant phase changes on reflected visible or ultraviolet light.

According to a first aspect of the invention, a modulator for extreme ultraviolet or soft X-ray radiation comprises a modulator structure that is reflective of extreme ultraviolet or soft X-ray radiation, said modulator structure including material having a high coefficient of thermal expansion, wherein said modulator structure expands in response to illumination with a light beam and alters a parameter of reflected extreme ultraviolet or soft X-ray radiation.

In some embodiments, the modulator structure comprises a multilayer mirror and the material having a high coefficient of thermal expansion comprises one or more layers of the multilayer mirror. In other embodiments, the modulator includes a substrate and the modulator structure comprises a multilayer mirror and a layer of the material having a high coefficient of thermal expansion between the multilayer mirror and the substrate. The modulator structure may be configured to modulate the amplitude and/or the phase of the reflected extreme ultraviolet or soft X-ray radiation. In further embodiments, the modulator includes a substrate and the modulator structure comprises an array of individual modulator elements affixed to the substrate. The modulator structure may be configured to produce a thermal pattern in response to a light beam having a spatial intensity pattern.

According to a second aspect of the invention, a lithography system is provided. The lithography system comprises a modulator for extreme ultraviolet or soft X-ray radiation, including a modulator structure that is reflective of extreme ultraviolet or soft X-ray radiation, said modulator structure including a material having a high coefficient of thermal expansion; an optical pattern generator configured to project a light beam carrying a spatial intensity pattern onto the modulator to produce a thermal pattern in the modulator; a photon source configured to illuminate the modulator with extreme ultraviolet or soft X-ray radiation; and a projection assembly configured to image onto a target extreme ultraviolet or soft X-ray radiation reflected from the modulator and modulated in response to the thermal pattern.

BRIEF DESCRIPTION OF THE DRAWINGS

For a better understanding of the present invention, reference is made to the accompanying drawings, which are incorporated herein by reference in which:

FIG. 1A is an enlarged, partial cross-sectional view of the modulator shown in FIG. 1;

DETAILED DESCRIPTION

Figure 1:
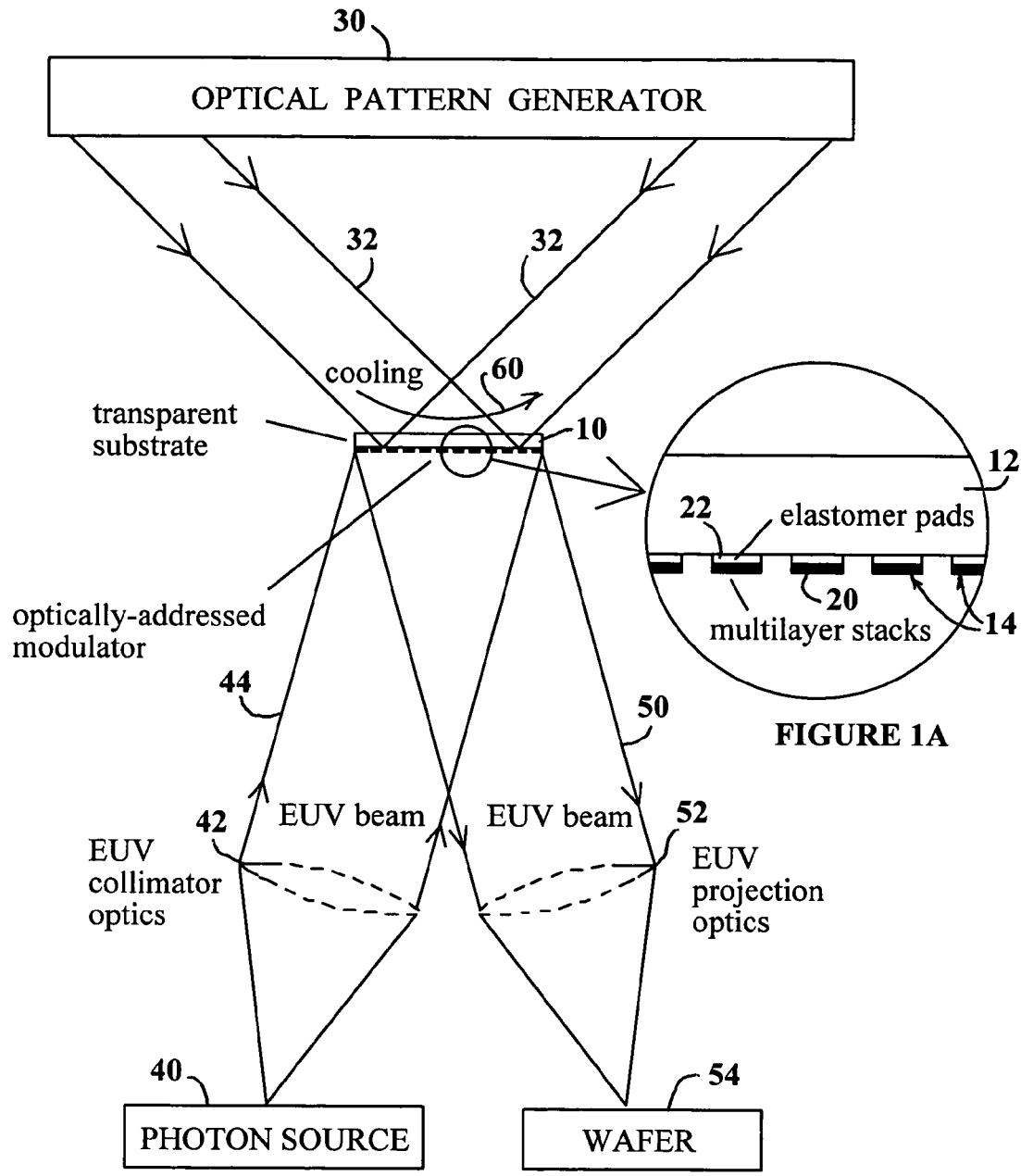
FIG. 1 is a schematic block diagram of a lithography system in accordance with a first embodiment of the invention.

A schematic block diagram of a lithography system in accordance with the first embodiment of the invention is shown in FIGS. 1 and 1A. A modulator 10 is configured for optical patterning and for reflection of extreme ultraviolet or soft X-ray radiation. While the discussion herein refers to EUV operation, it will be understood that the present invention is applicable to extreme ultraviolet and soft X-ray radiation, typically in a wavelength range of 1 to 100 nm (nanometers).

In the embodiment of FIGS. 1 and 1A, modulator 10 includes a light-transmissive substrate 12 and an array of modulator elements 14 affixed to substrate 12. Modulator elements 14 may be arranged in rows and columns and may define pixels of a pattern. Each of the modulator elements 14 may include a multilayer mirror 20 and a thermally expandable pad or layer 22 of a material having a high coefficient of thermal expansion. Other embodiments of modulator 10 are described below.

An optical pattern generator 30 projects one or more light beams 32 having a spatial intensity pattern 34 (FIG. 6) onto modulator 10. Optical pattern generator 30 may operate in the visible or deep ultraviolet wavelength range. The pattern 34 may represent, for example, a circuit pattern to be formed on a semiconductor wafer. A photon source 40 generates extreme ultraviolet or soft X-ray radiation. The EUV or soft X-ray radiation is collimated by collimator optics 42 and is projected onto modulator 10 as a collimated EUV beam 44. A reflected EUV beam 50 is projected by projection optics 52 onto a target, such as a semiconductor wafer 54. A cooling assembly may provide air and/or liquid cooling 60 of modulator 10.

In FIG. 1, radiation, typically at 13.5 nm, from photon source 40 is collimated and projected onto modulator 10, which acts as a "mask". The modulator 10 includes an array of multilayer mirrors reflecting at 13.5 nm, each mounted on the thermally expandable pad 22 which is affixed to substrate 12. Each pad 22 may be an elastomer, such as a silicon-containing elastomer, which absorbs radiation from visible or ultraviolet pattern-carrying beams incident through the light-transmissive substrate 12. Where the imprinting spatial pattern 34 is more intense, the elastomer pads respond with greater thermal expansion, imparting a phase shift to EUV radiation reflected from the multilayer mirrors on those layers. The reflected EUV radiation passes through de-magnifying projection optics 52 that image the "mask" onto a wafer. In this example, the mask is programmed as a spatial phase pattern, but this translates into an amplitude modulation pattern at the wafer. Other modulator embodiments provide direct amplitude modulation, as discussed below.

As circuit feature sizes decrease, there will be an advantage to using 13.5 nm EUV photons to expose a resist on the wafer. The short 13.5 nm wavelength facilitates diffraction-limited patterning of feature sizes w down to 20 nm, which can be generated, with $k_1=0.5$, $\Lambda=13.5$ nm, NA=0.3 in the formula $w=k_1 \Lambda/NA$. In this relation, $k_1$ is an empirical process constant and NA is the numerical aperture of the lithographic projection optic that images the array of modulator elements onto the wafer. If a projection de-magnification of 5× is considered, typical of today's designs for EUV projection optics, the modulator has to carry a pattern of 100 nm features in order to generate 20 nm features at the wafer. Such a pattern can be imprinted on the modulator using 200 nm radiation in a high numerical aperture optical illumination system.

The imprinting light field can be generated by many methods. For example, a very high rate of address is available at what would be the wafer location in a conventional deep ultraviolet (DUV) lithography exposure tool. A "hybrid" exposure system, shown in FIG. 2, has the optically addressed modulator 10 located at the normal wafer location of a DUV exposure tool. In this system, a conventional transmission DUV mask 100 that carries the circuit pattern is imaged by DUV projection optics 102 onto the modulator 10. The pattern is then imprinted by the modulator 10 onto extreme ultraviolet beam 50 which carries the pattern, via EUV projection optics 52, to the wafer 54. As the DUV mask 100 is translated, its image scrolls across the modulator 10, which is held stationary. The wafer 54 is moved in synchronism with the scrolled pattern, so that many EUV pulses, from different modulator elements, contribute to the final exposure intensity at each point on the wafer surface. In this way, a single defective modulator element does not significantly degrade the quality of the final pattern at the wafer.

Figure 2:
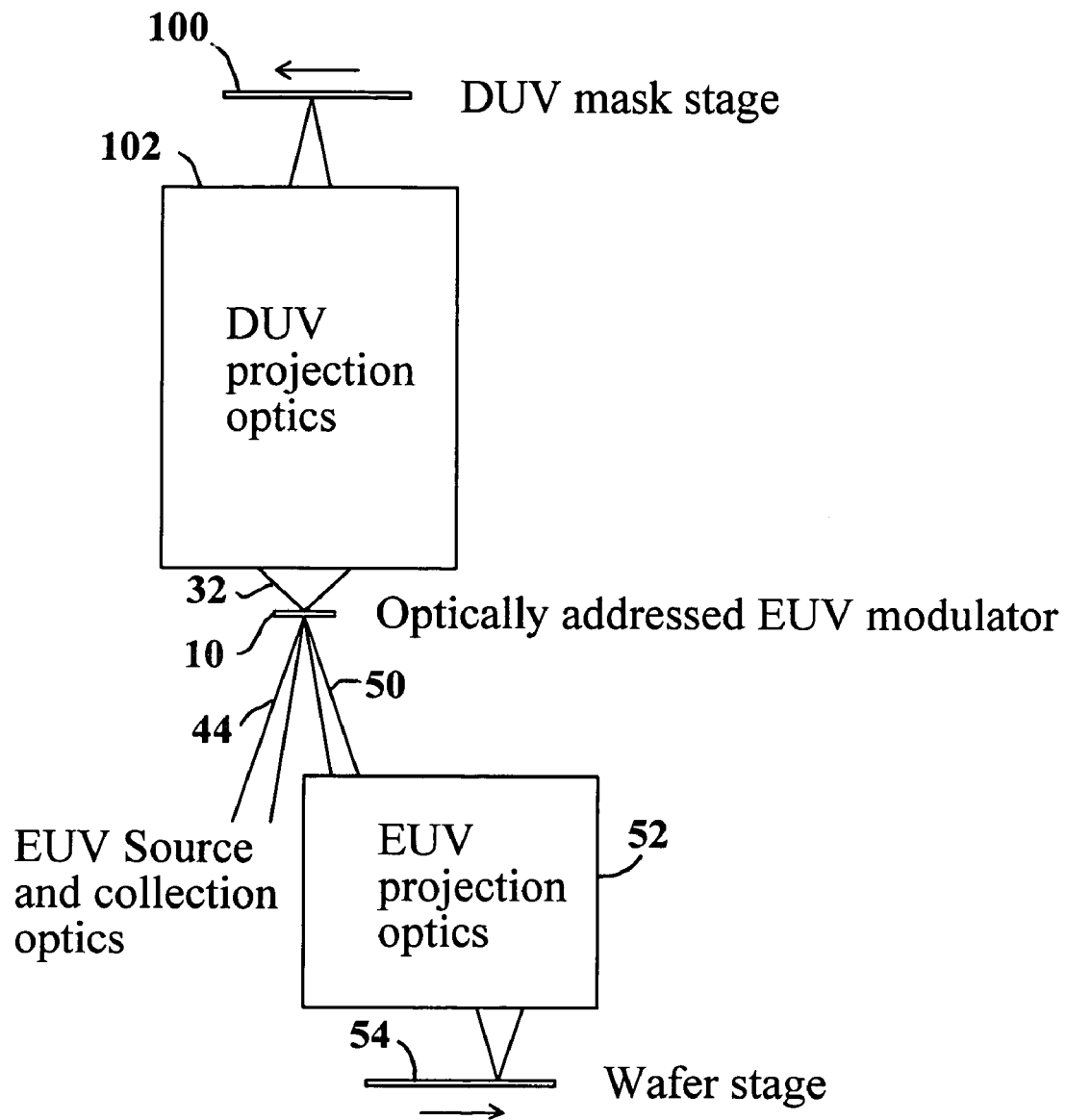
FIG. 2 is a schematic block diagram of a lithography system in accordance with a second embodiment of the invention.

In order to illustrate the potential lithography performance of the hybrid exposure system illustrated in FIG. 2, we consider an example. A pixel size of 20 nm at the wafer is assumed in order to compose 35 nm minimum features with good fidelity. The 20 nm pixel size corresponds to a $K_1$ of 0.45 with $\Lambda=13.5$ nm and NA=0.3.

The Example is Summarized as Follows:
a) EUV reduction ratio 7×, NA=0.3
b) Field size at EUV "reticle" (modulator area) 10 mm×50 mm. At wafer 1.4 mm×7.1 mm.
c) Pixel size at wafer 20 nm.
d) Minimum feature size with good resolution 35 nm.
e) Pixel size at modulator 140 nm. 110 nm multilayer pads separated by 30 nm channels. Fill 62%.
f) Optically addressed modulator stationary, scanned DUV.
g) DUV scanner velocity at EUV modulator 500 mm sec$^{-1}$.→71 mm sec$^{-1}$ at wafer.
h) Repetition frequency 4 kHz (both DUV and EUV, in synchronism).
i) Exposure time 1.4 mm at 71 mm sec$^{-1}$=0.02 sec=80 pulses.
j) Area printed in EUV per sec=7.1×71 mm$^2$ sec$^{-1}$=5 cm$^2$ sec$^{-1}$.
k) Resist 5 mJ cm$^{-2}$→25 mW 13.5 nm radiation at wafer.
l) EUV projection optics $(0.67)^6=0.090$→276 mW off modulator
m) Modulator fill 0.62×reflectivity 0.67=0.41→664 mW onto modulator n) Condenser (0.67)^6=0.090→7.4 W×2 for aperturing in system→15 W EUV needed
o) Brightness, 0.29 sr at wafer with 0.10 cm² implies for 2 sr collection, Source 1.0×1.5 mm
p) Pixels per sec=5 cm²/(20 nm)²=1.25×10^12
q) Blur. 50 nsec EUV pulse, 70 mm sec$^{-1}$→3.5 nm
r) Thermal load at modulator 2.2 mJ cm$^{-2}$×4 kHz=9 W cm$^{-2}$ (almost all DUV).

The performance assumed for the DUV stepper is "comfortable state of the art" in 2003 (for dry imaging), with the possible exception of the large field width of 50 mm, perpendicular to the scan direction. The DUV mask, if 4× optics is assumed, is 4 cm×20 cm, and has features at the 500 nm scale. The DUV pulse fluence reaching the modulator should be adequate, based on the 10 mJ/pulse output of present day ArF lasers, such as the Cymer XLA-100 (a 4 kHz laser). The pulse-to-pulse amplitude stability of this laser is important for accurate modulator movement. However, for patterns based on mixtures of π and zero phase differences, the image is not very sensitive to errors in phase of up to 10% of this range. The Cymer specification is for 3% stability (1σ). Because 80 pulses contribute to a single wafer pixel, some averaging is achieved, tending to smooth the pulse-by-pulse phase errors.

The present invention provides a method of simultaneously programming large numbers of micro-mirrors in sub-microsecond times, using the thermal imprint of an optical programming beam. This is considered to be useful in maskless lithography. However, many other uses are possible for this fast and simple method of modulation. Accordingly, the invention is not restricted to lithography, but described in general terms as a modulator of EUV or soft X-ray radiation.

Both amplitude and phase-modulation are included within the scope of the present invention, using different modulator structures.

Figure 3:
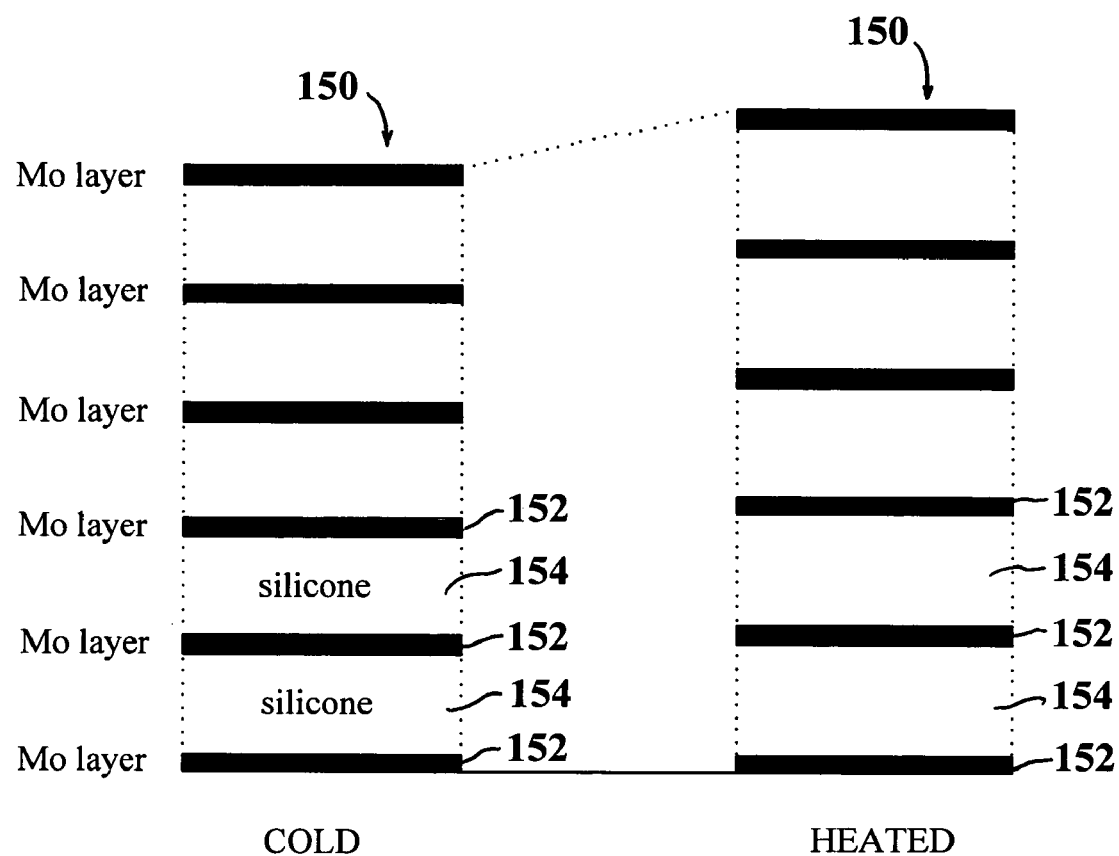
FIG. 3 is a schematic cross-sectional view of a multilayer mirror in accordance with a third embodiment of the invention, shown before and after heating.

FIG. 3 shows a modulator structure that can be used for amplitude modulation. A multilayer mirror 150 includes alternating layers of high refractive index and low refractive index materials. The materials and thicknesses are selected to reflect radiation of a given wavelength. Multilayer mirror 150 shown in FIG. 3 includes high index layers 152 and low index layers 154. In this embodiment, at least one of low index layers 154 has a high coefficient of thermal expansion. In the embodiment of FIG. 3, the high index material is molybdenum, for peak reflection at the EUV wavelength of 13.5 nm, and the low index material is a silicon-containing elastomer. Usually, pure silicon would be used but its coefficient of thermal expansion is too low to be useful in the modulator of the present invention. The composition of the low index layers may be a silicon elastomer having a thermal expansion coefficient in the range of 182 to 330 parts per million per degree centigrade. The material having a high coefficient of thermal expansion may include an absorber molecule that preferentially absorbs photons of the light beam. The multilayer mirror 150 is typically mounted on a light-transmissive substrate for support. In some embodiments, an array of multilayer mirrors, configured as shown in FIG. 3, is affixed to a substrate. Amplitude modulation results from a shift in the peak reflection wavelength of the modulator structure due to expansion of the elastomer layers after a heating impulse from the optical beam carrying the spatial intensity pattern. The left side of FIG. 3 shows multilayer mirror 150 before heating, and the right side of FIG. 3 shows multilayer mirror 150 after heating and expansion.

Figure 4A:
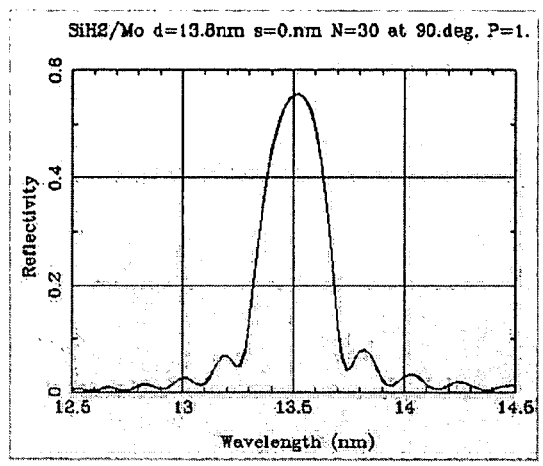
FIG. 4A is a graph of reflectivity as a function of wavelength for a multilayer mirror having peak reflectivity at 13.5 nm.
Figure 4B:
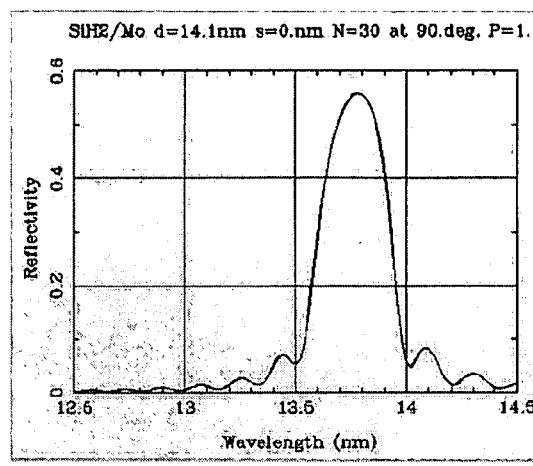
FIG. 4B is a graph of reflectivity as a function of wavelength for the multilayer mirror of FIG. 4A after heating.

In practical circumstances, the fractional bandwidth of EUV radiation incident on the modulator is approximately 2.5% because there are several reflections in the multilayer mirrors of the collimator optics, each of which have a fractional bandwidth of about 4% at 13.5 nm. In order to better match the modulator mirror's bandwidth to that of the incident radiation, it is possible to set the period of the Mo-silicone elastomer stack to one wavelength, rather than a half wavelength. This narrows the reflectivity bandwidth to 2.5%. FIGS. 4A and 4B show the calculated shift in peak reflection wavelength for a 2.5% fractional expansion in a one-wavelength period stack. At 13.5 nm the reflectivity drops from 55% without expansion to about 5% with expansion, giving a modulator contrast of 10:1.

The same principle can be applied to a multilayer stack mounted on a thin substrate, or even free-standing, in order to achieve a transmission modulator. If the substrate is sufficiently thin, it transmits EUV radiation. A multilayer stack containing silicone elastomer mounted on the substrate can be tuned to reflect EUV radiation when cool, but to transmit when heated. For example, a 20 layer one-wavelength stack has a non-resonant transmission when heated of 57%, and can be mounted on a 100 nm silicon nitride membrane with a transmission of 42%, giving an overall transmission of 24%. When cool, the stack rejects about 97% of EUV radiation. The transmission modulator has the disadvantage of being fragile, and the multilayer stack may not be cooled as rapidly, between pulses, as a reflection modulator mounted on a thick substrate.

Figure 5:
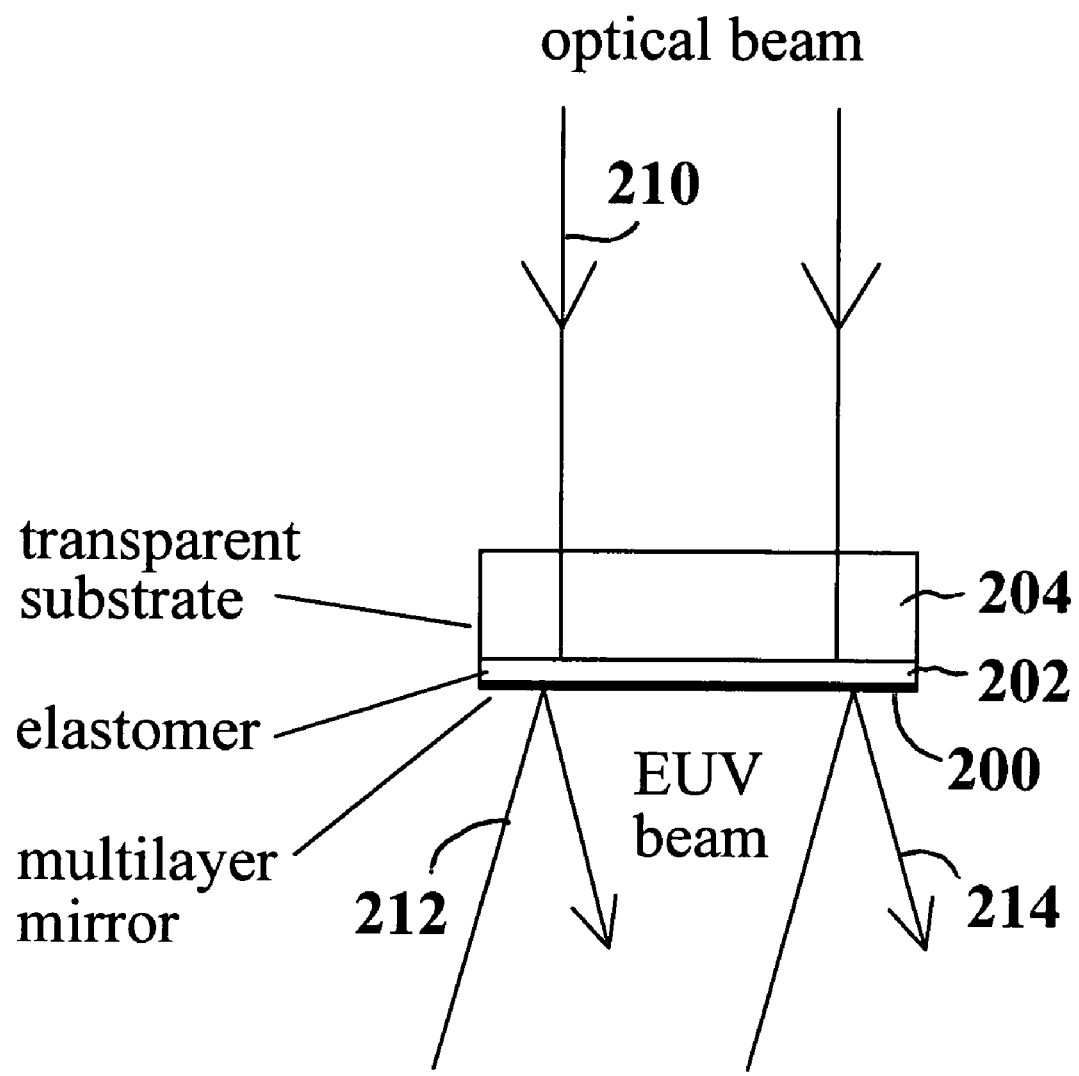
FIG. 5 is a simplified cross-sectional view of a modulator in accordance with a fourth embodiment of the invention.
Figure 6:
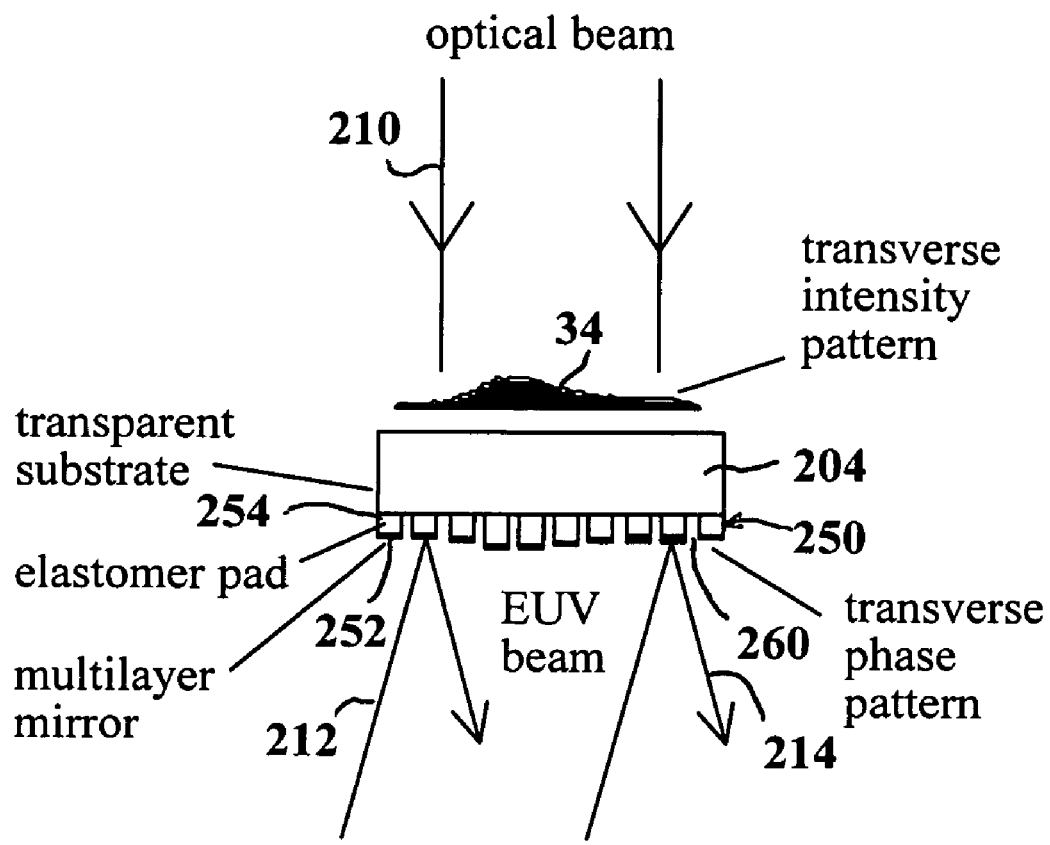
FIG. 6 is a simplified cross-sectional view of a modulator in accordance with a fifth embodiment of the invention.

Modulator structures suitable for phase modulation are shown in FIGS. 5 and 6. In FIG. 5, a single conventional Mo—Si multilayer mirror 200 of period one half wavelength at 13.5 nm is attached via a thermally expandable elastomer layer 202 to a transparent substrate 204. Visible or ultraviolet radiation of an imprint beam 210 is incident on layer 202 after traveling through the substrate. The elastomer layer 202 can be designed to strongly absorb the imprint beam 210, causing a temperature increase that is rapidly translated into an expansion δ of layer 202. After the multilayer mirror 200 has moved a distance δ, reflected EUV beam 214 has a 4δπ/Λ phase change relative to incident EUV beam 212, where Λ is the EUV wavelength.

Figure 7:
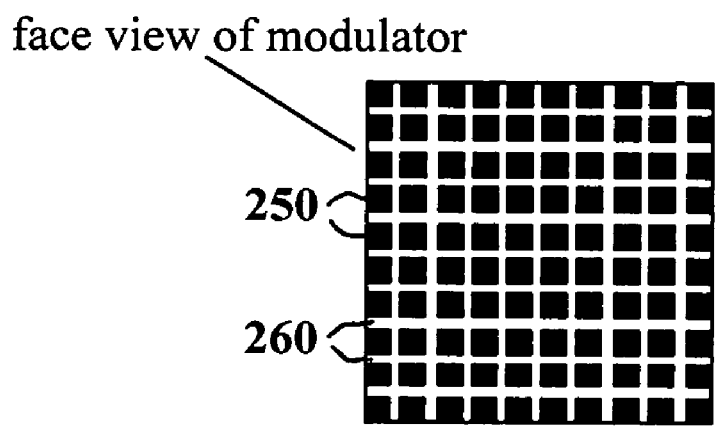
FIG. 7 is a front view of the modulator shown in FIG. 6.

The principle illustrated in FIG. 5 is applied in FIG. 6 to a two-dimensional array of modulator elements 250 separately mounted on substrate 204 and separated by channels 260. A front view of the array of modulator elements 250 is shown in FIG. 7. Each of the modulator elements 250 may include a multilayer mirror 252 and a thermally expandable pad 254 between multilayer mirror 252 and substrate 204. Each of the modulator elements 250 may define a pixel of a pattern. According to the example given above, the pixel size may be 140 nm by 140 nm, with 110 nm square modulator elements separated by 30 nm channels. It will be understood that different modulator element dimensions may be utilized within the scope of the invention. When the imprint beam 210 is spatially modulated, the pads 254 experience varying expansions, with the result that an intensity distribution in the imprint beam is translated into a corresponding phase distribution in the reflected EUV beam 214. The spatial resolution is determined by the transverse scale size of the individual modulator elements. It is preferable to divide the surface into an array of independent modulator elements because otherwise, on short scale length, transverse heat conduction may smooth out the transverse spatial temperature profile, reducing the achievable spatial resolution. Additionally, the stiffness of an undivided multilayer mirror may become an obstacle to deformation on short transverse scale lengths.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

The invention claimed is:

1. A modulator for extreme ultraviolet or soft X-ray radiation, comprising:
a modulator structure that is reflective of extreme ultraviolet or soft X-ray radiation, said modulator structure including material having a high coefficient of thermal expansion, wherein said modulator structure expands in response to illumination with a light beam and alters a parameter of reflected extreme ultraviolet or soft X-ray radiation.

2. A modulator as defined in claim 1, wherein said modulator structure comprises a multilayer mirror, the material having a high coefficient of thermal expansion comprising one or more layers of the multilayer mirror.

3. A modulator as defined in claim 1, further comprising a substrate, wherein said modulator structure comprises a multilayer mirror and a layer of the material having a high coefficient of thermal expansion between the multilayer mirror and the substrate.

4. A modulator as defined in claim 1, wherein the modulator structure is configured to modulate the amplitude of the reflected extreme ultraviolet or soft X-ray radiation.

5. A modulator as defined in claim 1, wherein the modulator structure is configured to modulate the phase of the reflected extreme ultraviolet or soft X-ray radiation.

6. A modulator as defined in claim 1, further comprising a substrate, wherein said modulator structure comprises an array of individual modulator elements affixed to the substrate.

7. A modulator as defined in claim 6, wherein each of the modulator elements comprises a multilayer mirror, the material having a high coefficient of thermal expansion comprising one or more layers of the multilayer mirror.

8. A modulator as defined in claim 6, wherein each of the modulator elements comprises a multilayer mirror and a layer of the material having a high coefficient of thermal expansion between the multilayer mirror and the substrate.

9. A modulator as defined in claim 1, wherein said modulator structure is configured to produce a thermal pattern in response to a light beam having a spatial intensity pattern.

10. A modulator as defined in claim 1, wherein said modulator structure is reflective of radiation in a wavelength range of 10 to 15 nanometers.

11. A modulator as defined in claim 1, wherein said modulator structure includes a multilayer mirror having molybdenum as a high index material.

12. A modulator as defined in claim 1, wherein the material having a high coefficient of thermal expansion comprises a silicon-containing elastomer.

13. A modulator as defined in claim 1, wherein the material having a high coefficient of thermal expansion includes an absorber molecule that preferentially absorbs photons of the light beam.

14. A modulator as defined in claim 1, further comprising a light-transmissive substrate having said modulator structure affixed thereto.

15. A modulator as defined in claim 14, wherein the modulator structure is configured for illumination through the substrate.

16. A lithography system comprising:
a modulator for extreme ultraviolet or soft X-ray radiation, comprising a modulator structure that is reflective of extreme ultraviolet or soft X-ray radiation, said modulator structure including a material having a high coefficient of thermal expansion;
an optical pattern generator configured to project a light beam carrying a spatial intensity pattern onto the modulator to produce a thermal pattern in the modulator;
a photon source configured to illuminate the modulator with extreme ultraviolet or soft X-ray radiation; and
a projection assembly configured to image onto a target extreme ultraviolet or soft X-ray radiation reflected from the modulator and modulated in response to the thermal pattern.

17. A lithography system as defined in claim 16, wherein the modulator comprises a multilayer mirror, the material having a high coefficient of thermal expansion comprising one or more layers of the multilayer mirror.

18. A lithography system as defined in claim 16, wherein the modulator further comprises a substrate, said modulator structure comprising a multilayer mirror and a layer of the material having a high coefficient of thermal expansion between the multilayer mirror and the substrate.

19. A lithography system as defined in claim 16, wherein the modulator is configured for amplitude modulation of the reflected extreme ultraviolet or soft X-ray radiation.

20. A lithography system as defined in claim 16, wherein the modulator is configured for phase modulation of the reflected extreme ultraviolet or soft X-ray radiation.

21. A lithography system as defined in claim 16, wherein the modulator comprises a substrate and an array of individual modulator elements affixed to the substrate.

22. A lithography system as defined in claim 16, wherein the photon source produces radiation in a wavelength range of 10 to 15 nanometers.

23. A lithography system as defined in claim 16, wherein the modulator includes a multilayer mirror having molybdenum as a high index material.

24. A lithography system as defined in claim 16, wherein the material having a high coefficient of thermal expansion comprises a silicon-containing elastomer.

25. A lithography system as defined in claim 16, wherein the material having a high coefficient of thermal expansion includes an absorber molecule that preferentially absorbs photons of the optical intensity pattern.

26. A lithography system as defined in claim 16, wherein the modulator includes a light-transmissive substrate, wherein said modulator structure is affixed to the substrate.

27. A lithography system as defined in claim 26, wherein the optical pattern generator is configured to project the spatial intensity pattern through the light-transmissive substrate onto said modulator structure.

28. A lithography system as defined in claim 16, wherein the spatial intensity pattern is pulsed and wherein the photon source is pulsed to illuminate the modulator when the thermal pattern produced by the pulsed spatial intensity pattern is present in the modulator.

29. A lithography system as defined in claim 16, wherein the spatial intensity pattern and the target are moved in synchronism relative to the modulator.

30. A lithography system as defined in claim 16, wherein the spatial intensity pattern and the extreme ultraviolet or soft X-ray radiation are incident on the modulator from opposite sides.

31. A lithography system as defined in claim 16, further comprising a cooling assembly configured to cool the modulator.

32. A modulator for extreme ultraviolet or soft X-ray radiation, comprising:
  a modulator structure that is transmissive of extreme ultraviolet or soft X-ray radiation, said modulator structure including a material having a high coefficient of thermal expansion, wherein said modulator structure expands in response to illumination with a light beam and alters a parameter of transmitted extreme ultraviolet or soft X-ray radiation.

33. A modulator for extreme ultraviolet or soft X-ray radiation, comprising:
  a light-transmissive substrate; and
  a modulator structure on said substrate that has a first reflectivity of extreme ultraviolet or soft X-ray radiation at a first temperature and has a second reflectivity of extreme ultraviolet or soft X-ray radiation at a second temperature, said modulator structure including at least one layer of a material having a high coefficient of thermal expansion.

34. A modulator as defined in claim 33, wherein said modulator structure comprises a multilayer mirror having one or more layers of a material having a high coefficient of thermal expansion.

35. A modulator as defined in claim 33, wherein said modulator structure comprises a multilayer mirror and a layer of a material having a high coefficient of thermal expansion between the multilayer mirror and the substrate.

36. A modulator as defined in claim 33, wherein said modulator structure comprises an array of individual modulator elements on the substrate, each of the individual modulator elements including a multilayer mirror.

* * * * *